(12) United States Patent
Drexler et al.

(10) Patent No.: US 11,292,225 B2
(45) Date of Patent: Apr. 5, 2022

(54) SYSTEMS AND METHODS FOR CREATING A HONEYCOMB CORE WITH INTEGRATED ELECTRONIC COMPONENTS

(71) Applicant: The Boeing Company, Chicago, IL (US)

(72) Inventors: Jason Drexler, Brier, WA (US); Xiaoxi Wang, Mukilteo, WA (US); John C. Wilde, Mill Creek, WA (US)

(73) Assignee: The Boeing Company, Chicago, IL (US)

( * ) Notice: Subject to any disclaimer, the term of this patent is extended or adjusted under 35 U.S.C. 154(b) by 243 days.

(21) Appl. No.: 16/363,565

(22) Filed: Mar. 25, 2019

(65) Prior Publication Data

US 2020/0307144 A1  Oct. 1, 2020

(51) Int. Cl.

| | |
|---|---|
| *B32B 3/12* | (2006.01) |
| *H05K 3/12* | (2006.01) |
| *B29D 99/00* | (2010.01) |
| *B32B 37/14* | (2006.01) |
| *H05K 1/11* | (2006.01) |
| *H05K 1/09* | (2006.01) |
| *B29L 31/60* | (2006.01) |

(52) U.S. Cl.
CPC ............ *B32B 3/12* (2013.01); *B29D 99/0089* (2013.01); *B32B 37/146* (2013.01); *H05K 1/092* (2013.01); *H05K 1/115* (2013.01); *H05K 3/1275* (2013.01); *B29L 2031/608* (2013.01); *B32B 2605/18* (2013.01)

(58) Field of Classification Search
None
See application file for complete search history.

(56) References Cited

U.S. PATENT DOCUMENTS

| | | |
|---|---|---|
| 2,734,843 A | 2/1956 | Steele |
| 2,828,235 A | 3/1958 | Holland et al. |
| 3,655,476 A | 4/1972 | Siegal |
| 3,660,217 A | 5/1972 | Kehr et al. |
| 3,895,152 A | 7/1975 | Carlson et al. |
| 4,299,872 A | 11/1981 | Miguel et al. |
| 5,137,768 A | 8/1992 | Lin |
| 5,180,619 A | 1/1993 | Landi et al. |
| 5,401,706 A | 3/1995 | Fischer |

(Continued)

FOREIGN PATENT DOCUMENTS

| | | |
|---|---|---|
| CN | 201971148 | 9/2002 |
| JP | H045033 A | 1/1992 |
| JP | 251172 B2 | 6/1996 |

OTHER PUBLICATIONS

Stephen Mraz, Printed Copper Inks Now Available for Conductive Patterns, Mar. 28, 2017, MachineDesign, https://www.machinedesign.com/materials/article/21835320/printed-copper-inks-now-available-for-conductive-patterns (Year: 2017).*

(Continued)

*Primary Examiner* — Mary I Omori
(74) *Attorney, Agent, or Firm* — Vivacqua Crane PLLC (57) ABSTRACT

A honeycomb core includes a honeycomb substrate comprised of a number of sheets. A number of traces are printed onto the sheets of the honeycomb substrate. A number of integrated electronic devices are disposed within the honeycomb substrate. The integrated electronic devices are electrically coupled to the traces.

27 Claims, 9 Drawing Sheets

(56) References Cited

U.S. PATENT DOCUMENTS

| | | | |
|---|---|---|---|
| 5,445,861 A | 8/1995 | Newton et al. | |
| 5,589,016 A | 12/1996 | Hoopingarner et al. | |
| 5,662,982 A * | 9/1997 | Diaz | H01Q 1/38 |
| | | | 428/116 |
| 6,003,283 A | 12/1999 | Hull | |
| 6,153,687 A | 11/2000 | Wang et al. | |
| 6,451,406 B1 | 9/2002 | Wang et al. | |
| 9,640,164 B2 | 5/2017 | Gerken et al. | |
| 10,054,567 B2 | 8/2018 | Georgeson et al. | |
| 2006/0180346 A1 * | 8/2006 | Knight | H05K 3/4623 |
| | | | 174/265 |
| 2006/0231487 A1 | 10/2006 | Bartley et al. | |
| 2008/0044621 A1 | 2/2008 | Strauss | |
| 2008/0145600 A1 * | 6/2008 | Hendren | D21H 21/34 |
| | | | 428/116 |
| 2008/0317802 A1 | 12/2008 | Lee et al. | |
| 2009/0008142 A1 | 1/2009 | Shimizu et al. | |
| 2009/0311469 A1 | 12/2009 | Hoetzeldt et al. | |
| 2013/0224405 A1 * | 8/2013 | Nagerl | H05K 7/14 |
| | | | 428/34.1 |
| 2013/0269742 A1 * | 10/2013 | Pingree | H01L 35/34 |
| | | | 136/205 |
| 2015/0282294 A1 * | 10/2015 | Wakuda | H05K 1/028 |
| | | | 361/749 |
| 2017/0182723 A1 * | 6/2017 | Calisch | B64C 3/20 |
| 2017/0326858 A1 | 11/2017 | Wang | |
| 2017/0326859 A1 | 11/2017 | Wang et al. | |
| 2018/0186140 A1 | 7/2018 | Drexler et al. | |
| 2020/0307135 A1 | 10/2020 | Wilde et al. | |

OTHER PUBLICATIONS

Chemically Curing, Jan. 19, 2018, Adesives.org Sealants.org (Year: 2018).*
Substrate's Dynes/cm, Oct. 22, 2017, Steven Label (Year: 2017).*
EP, Extended Search Report, pp. 1-4, dated Apr. 22, 2020.
Edward M. Petrie, "Adhesive Bonding of Polyolefin", Techsil White Paper, Jun. 2013, pp. 1-6, UK.

* cited by examiner

SYSTEMS AND METHODS FOR CREATING A HONEYCOMB CORE WITH INTEGRATED ELECTRONIC COMPONENTS

INTRODUCTION

The present disclosure relates to systems and methods for creating honeycomb cores. More specifically, the present disclosure relates to systems and methods for creating honeycomb cores with integrated electronic components.

BACKGROUND

Decorative or interior panels and acoustic panels made from a composite part are used in many industries. The composite part includes a honeycomb core with one or more surface plies or laminates applied to the honeycomb core. The honeycomb core separates the surface plies by spacing the surface plies apart and adding thickness to the panel, thus increasing bending strength of the panel. In addition, the honeycomb core may provide acoustic dampening and fireproofing to the composite part by selecting materials or configurations that reduce sound transmission or are fire resistant.

While these composite parts are useful for their intended function, there is a need in the art for systems and methods for creating composite parts having honeycomb cores that have added functionality.

SUMMARY

In one aspect, a honeycomb core with integrated electronics is provided. The honeycomb core includes a honeycomb substrate comprised of a number of sheets. A number of traces are printed onto the sheets of the honeycomb substrate. A number of integrated electronics are disposed in the honeycomb substrate. The integrated electronics are connected to the traces.

In another aspect, a honeycomb core is provided. The honeycomb core includes a honeycomb substrate comprised of a number of sheets and defining a number of cells. An electronic device is disposed in the honeycomb substrate. The electronic device may be disposed within the cell or printed on the sheets.

In another aspect, a method for creating a honeycomb core is provided. The method includes printing a number of traces on each of a number of sheets. Next, the honeycomb core is formed from the sheets.

In yet another aspect, a method of using a honeycomb core having an integrated electronic device is provided. The method includes powering the electronic device disposed within the honeycomb core. Next, an output is generated from the electronic device. The output may include power, signals, acoustics, and/or electrostatic discharges.

The features, functions, and advantages that have been discussed may be achieved independently in various aspects or may be combined in other aspects further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
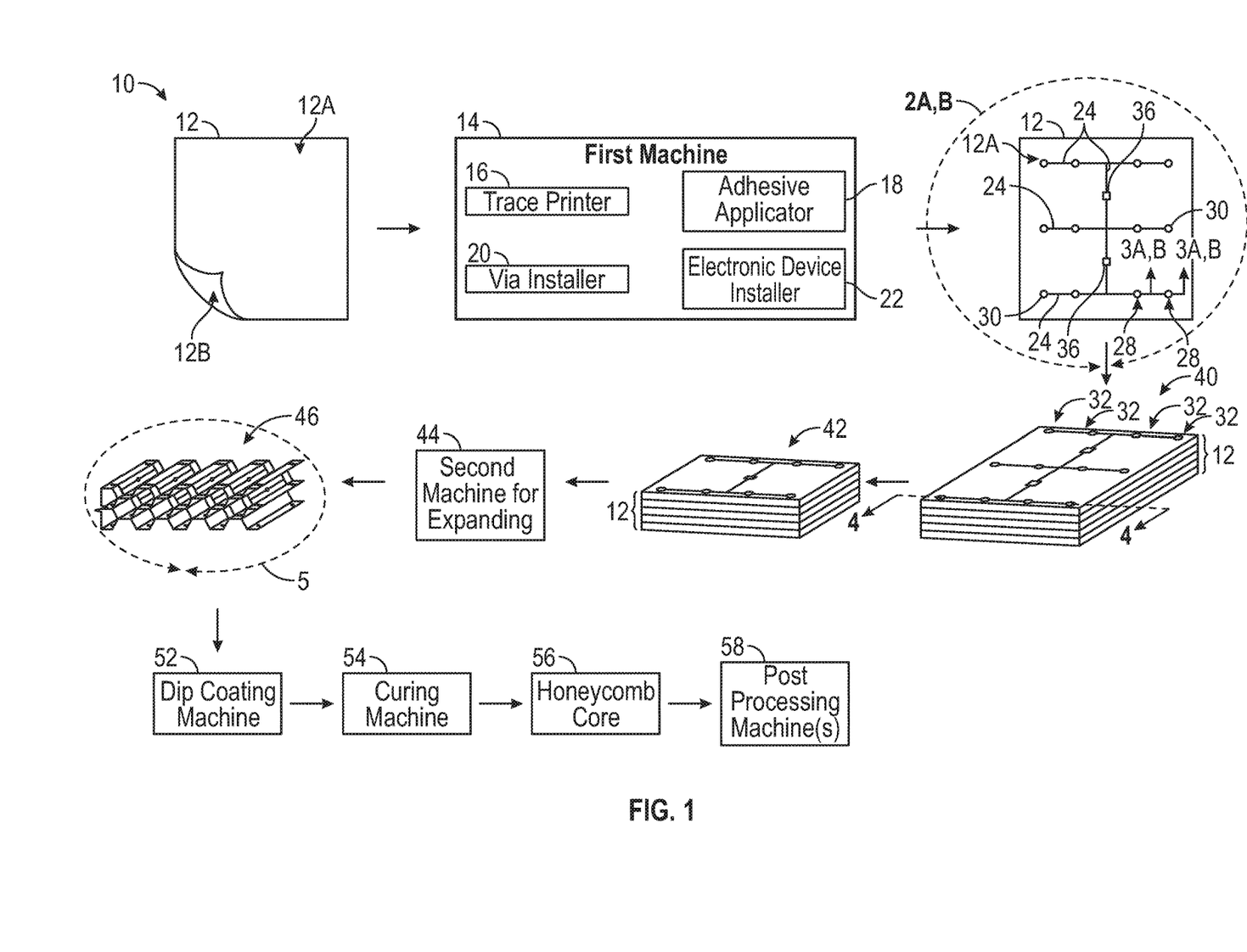
FIG. 1 is a schematic diagram of a system for creating a honeycomb core with electronic components, according to an exemplary aspect.

Referring to FIG. 1, a schematic diagram of a system 10 for manufacturing a honeycomb core with electronic components is shown. The system 10 may be employed in the context of aircraft manufacturing and service, as will be described below. For example, the system 10 may be used in component and subassembly manufacturing of an aircraft including interior fabrication, acoustic panels, system integration of the aircraft, airframe fabrication, and routine maintenance and service of the aircraft. However, the system 10 may be used in various other industries, including automotive, construction, graphics, and general transportation industry, to name but a few.

The system 10 includes a sheet 12 that is fed into a first machine 14. The sheet 12 may be roll fed using a roll of material fed in a continuous process (not shown) into the first machine 14 or sheet fed, as illustrated in FIG. 1. The sheet has a first surface 12A and a second surface 12B opposite the first surface 12A. The sheet 12 is preferably an aromatic polyamide paper, such as sold under the trademark NOMEX®, that provides mechanical toughness, flexibility and resilience. However, the sheet 12 may be a woven fabric, cellulose paper, plastic, or non-conductive metal without departing from the scope of the present disclosure.

The first machine 14 is configured to apply various electronic components and other materials onto the sheet 12. The first machine 14 includes a trace printer 16, an adhesive applicator 18, a via installer 20, and an electronic device installer 22. It should be appreciated that the trace printer 16, the adhesive applicator 18, the via installer 20, and the electronic device installer 22 may be separate machines without departing from the scope of the present disclosure. In addition, the trace printer 16, the adhesive applicator 18, the via installer 20, and the electronic device installer 22 may act on the sheet 12 in any order without departing from the scope of the present disclosure.

The trace printer 16 is a direct write printer that prints a number of traces 24 onto the first surface 12A of the sheet 12. The traces 24 may be printed on the first surface 12A of the sheet 12 or on both the first surface 12A and the second surface 12B of the sheet 12. Generally, the traces 24 are conductive. For example, the traces 24 include an electrically conductive ink. The traces 24 are printed on to the sheet 12 in a pattern to create a circuit, as will be described below.

Figure 2A:
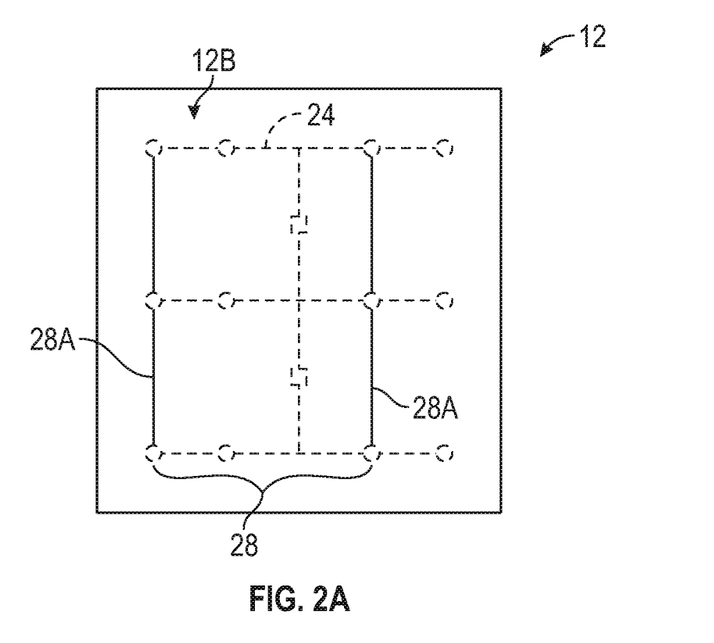
FIG. 2A is an enlarged view of a sheet shown in FIG. 1.
Figure 2B:
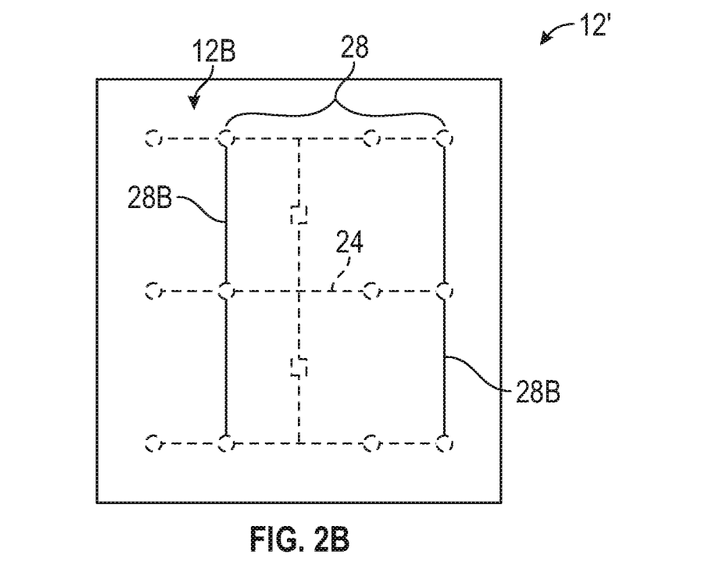
FIG. 2B is an enlarged view of an alternating sheet shown in FIG. 1.

The adhesive applicator 18 applies an adhesive 28 onto the second surface 12B of the sheet 12. The adhesive applicator 18 may be, for example, a printer or a coating machine. FIG. 2A shows the second surface 12B of the sheet 12 where the adhesive 28 is applied as strips of adhesives 28A onto the sheet 12. The strips of adhesives 28A will adhere to the first surface 12A of subsequently stacked alternating sheets. FIG. 2B shows an alternating sheet 12' having the adhesive 28 applied in strips of adhesives 28B that are offset from the strips of adhesives 28A (FIG. 2A). Offsetting the strips of adhesives 28B on alternating sheets 12' allows the sheets 12 and the alternating sheets 12' to form a honeycomb-like structure when stacked and then expanded.

Figure 3A:
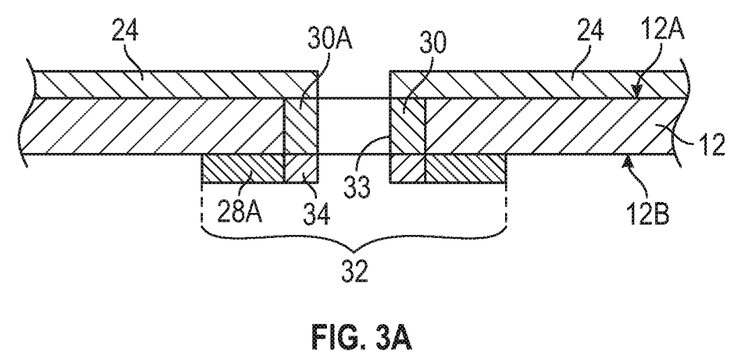
FIG. 3A is a cross section of a sheet and a via shown in FIG. 1 viewed in the direction of arrow 3A-3A.

Returning to FIG. 1, the via installer 20 is configured to install a number of vias 30 through the sheet 12. The vias 30 act as conduits of electricity and/or as venting pathways for gasses through the sheet 12. In a first example, the vias 30 are configured as a grommet. FIG. 3A shows a cross-section of the sheet 12 through one of the vias 30 after passing through the first machine 14. The via 30 extends through the sheet 12 from the first surface 12A to the second surface 12B. The via 30 is located along a bond line 32 which is defined as a location of one of the strips of adhesive 28A or strips of adhesive 28B. The bond line 32 is a location where adjacent, stacked sheets 12 are bonded or adhered together, as will be described below. The via 30 has an annular body 30A which defines a hole 33 through the sheet 12. The hole 33 allows for venting through the via 30. The annular body 30A is in contact with the traces 24. The via 30 is electrically conductive and made from copper, aluminum, silver, gold, tin, or any other conducting material. In one aspect, the adhesive applicator 18 (FIG. 1) applies a conductive adhesive 34 overtop the via 30. The conductive adhesive 34 provides an electrical connection between the vias 30 that are aligned between the sheets 12, as will be described below in reference to FIG. 3.

Figure 3B:
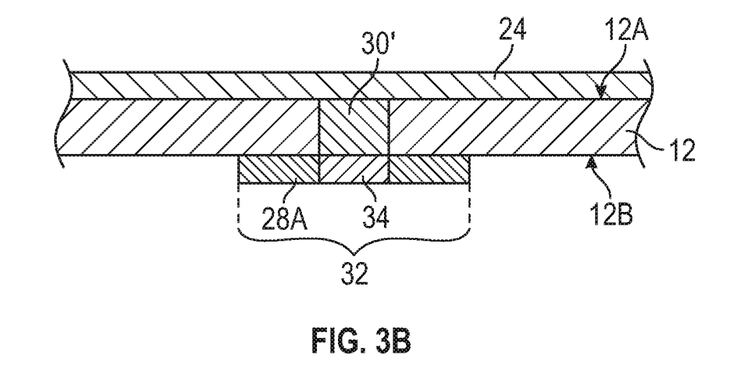
FIG. 3B is a cross section of a sheet and another example of a via shown in FIG. 1 viewed in the direction of arrow 3B-3B.

In a second example, the vias 30 are replaced with vias 30' configured as a rivet. FIG. 3B shows a cross-section of the sheet 12 through one of the vias 30' after passing through the first machine 14. The via 30' extends through the sheet 12 from the first surface 12A to the second surface 12B. The via 30' is in electrical contact with the traces 24. The via 30' is solid and unlike the via 30 (FIG. 3A), does not define an opening. The via 30' is electrically conductive and made from copper, aluminum, silver, gold, tin, or any other conducting material. In one aspect, the adhesive applicator 18 (FIG. 1) applies the conductive adhesive 34 overtop the via 30'. The conductive adhesive 34 provides an electrical connection between the vias 30' that are aligned between the sheets 12, as will be described below in reference to FIG. 3.

Returning to FIG. 1, the electronic device installer 22 is a direct write printer that prints a number of electronic devices 36 onto the first surface 12A of the sheet 12. The electronic devices 36 are in contact with the traces 24 to form an electrical circuit. The electronic devices 36 may be printed on the first surface 12A of the sheet 12 or on both the first surface 12A and the second surface 12B of the sheet 12. In one aspect of the present disclosure, the electronic devices 36 may include a sensor such as a mold or fungus detector, a humidity sensor, a pressure sensor, an acoustic or vibration sensor, or any combination thereof, etc. The electronic devices 36 are powered by electrical current supplied through the traces 24. The power may be supplied by a source (not shown) connected to the traces 24 or by the electronic devices 36 themselves.

Figure 4:
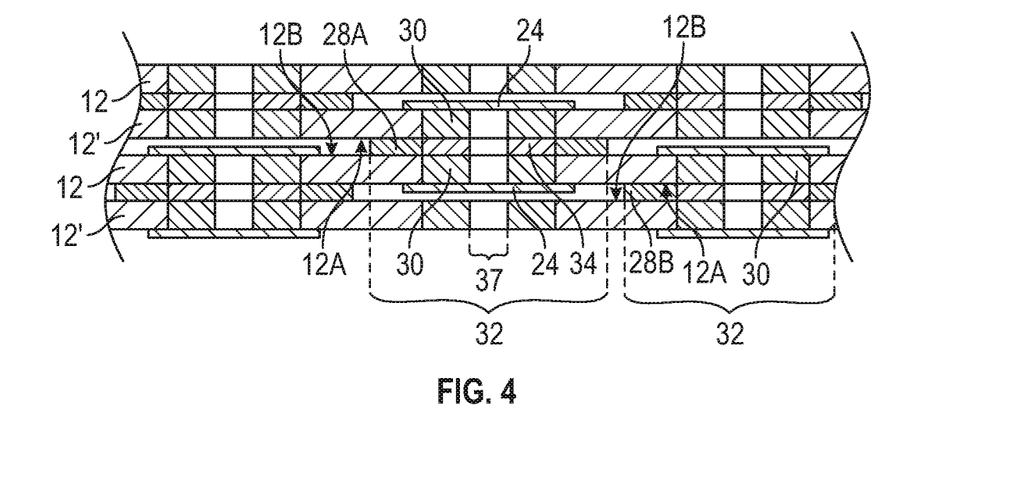
FIG. 4 is a cross section of a stack of sheets shown in FIG. 1 viewed in the direction of arrow 4-4.

Once through the first machine 14, a number of the sheets 12 are then stacked to form a block 40. FIG. 4 shows a cross-section of the block 40. The block is comprised of the sheets 12 and the alternating sheets 12'. The strips of adhesives 28A on the sheet 12 adhere to the first surfaces 12A of the alternating sheets 12'. The strips of adhesives 28A on the alternating sheets 12' adhere to the first surfaces 12A of the sheets 12. Where the strips of adhesives 28A adhere to the alternating sheets 12' and the strips of adhesives 28B adhere to the sheets 12 form the bond lines 32. The sheets 12 and the alternating sheets 12' are arranged such that the vias 30 align with one another to form venting pathways 37. The conductive adhesive 34 electrically connects adjacent, aligned vias 30.

Figure 5:
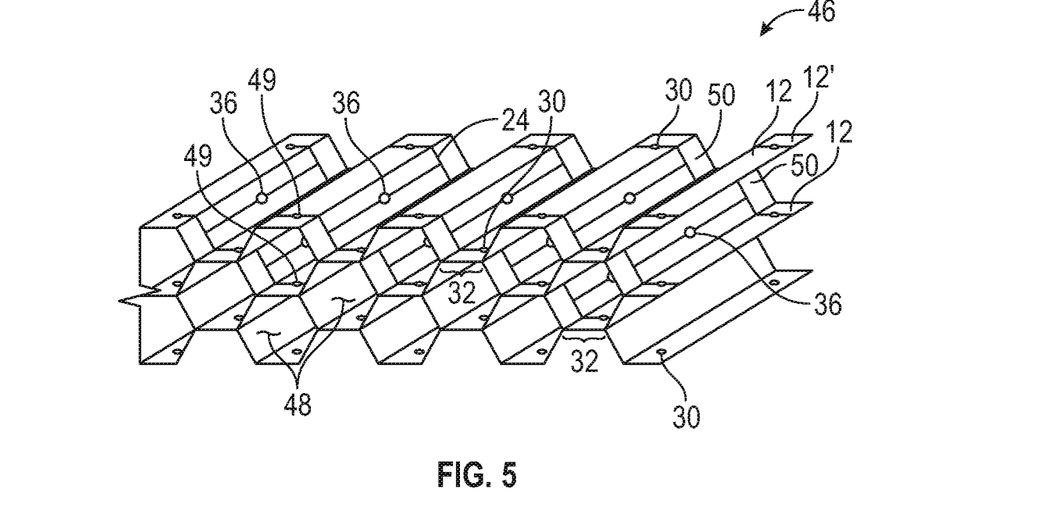
FIG. 5 is an enlarged, perspective view of a honeycomb substrate shown in FIG. 1.

Returning to FIG. 1, the adhesive 28 may be allowed to cure before optionally slicing or cutting the block 40 into sections 42. The sections 42 are then placed into a second machine 44 for expanding the sections 42 to form the honeycomb substrate 46. The second machine 44 may take various forms but generally pulls the section 42 apart. FIG. 5 shows an enlarged view of the honeycomb substrate 46. When expanded, the sheets 12 and the alternating sheets 12' remained connected at the bond lines 32. A number of cells 48 are formed between the sheets 12 and the alternating sheets 12'. The cells 48 are illustrated as hexagonal though it should be appreciated that the cells 48 may have other shapes without departing from the scope of the present disclosure. The electronic devices 36 are disposed on walls 50 of the cells 48. The walls 50 are disposed between the bond lines 32. The venting pathways 49 communicate between the cells 48 through the vias 30.

Returning again to FIG. 1, the honeycomb substrate 46 is then placed into a dip coating machine 52 to apply a resin over the honeycomb substrate 46. The resin adheres to the honeycomb substrate 46. The resin is preferably a phenolic resin having a surface energy ranging from 40 to 50 dyn/cm. The resin may also include Epoxy and polyester resins. The resin covers the entire honeycomb substrate 46. The honeycomb substrate 46 is then removed from the dip coating machine 52 and placed in a curing machine 54. The curing machine 54, such as an autoclave or oven, cures the resin on the honeycomb substrate 46 at an elevated temperature. Once cured, the honeycomb substrate 46 forms a honeycomb core 56 with electronic components that may be placed in one or more post-processing machines 58 (FIG. 1), such as laminating machines which may add a face sheet, out-of-autoclave curing machines, etc., to form a final part (not shown).

Figure 6:
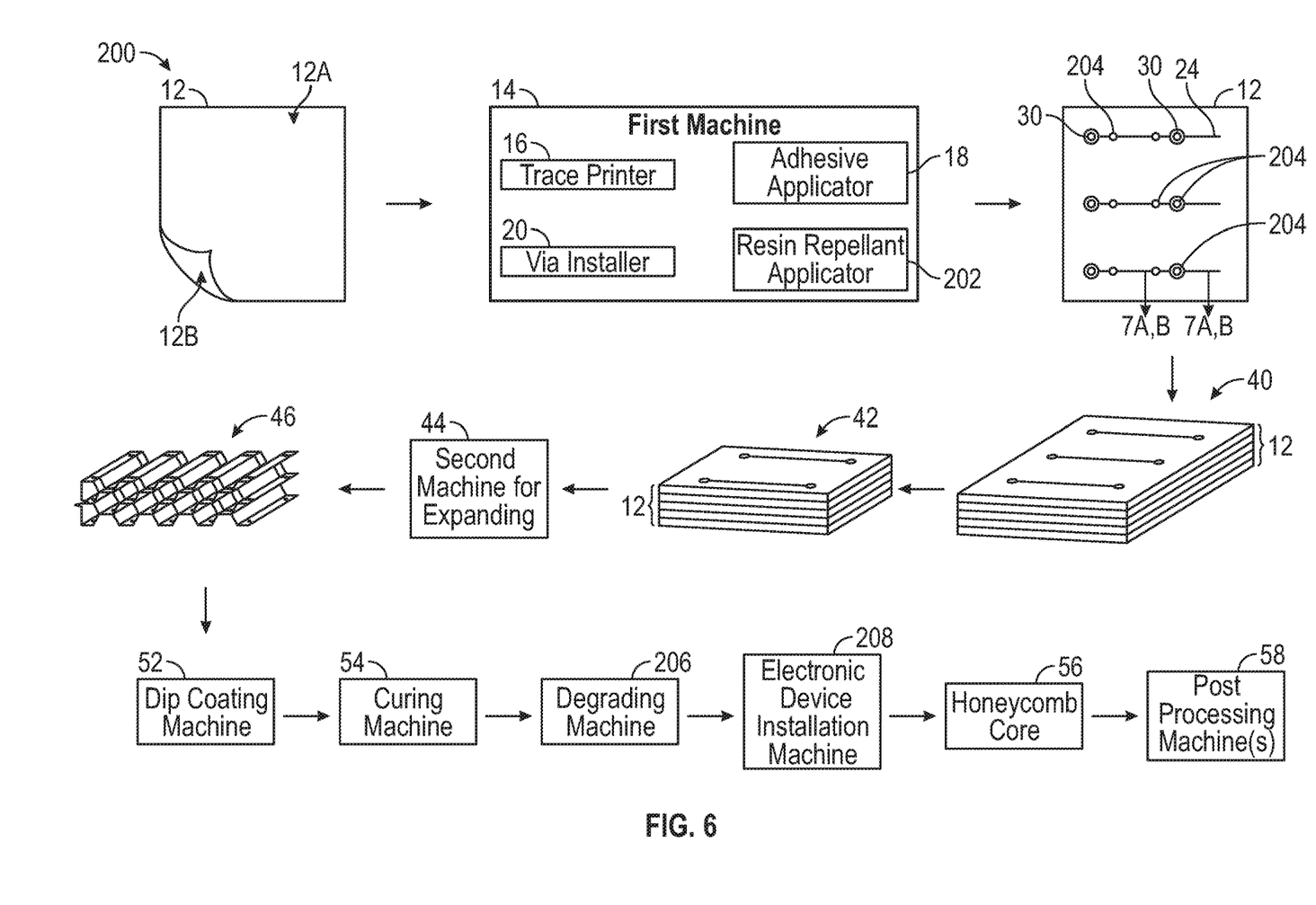
FIG. 6 is a schematic diagram of another system for creating a honeycomb core with electronic components, according to an exemplary aspect.

FIG. 6 is a schematic diagram of another system 200 for manufacturing a honeycomb core with electronic components. The system 200 is similar to the system 10 and like components are indicated by like reference numbers. However, in the system 200, the electronic device installer 22 is replaced with a resin repellant applicator 202. The resin repellant applicator 202 is a printer or coating machine that applies a resin repellant 204 onto the first surface 12A of the sheet 12 overtop the vias 30 and a portion of the traces 24.

Figure 7A:
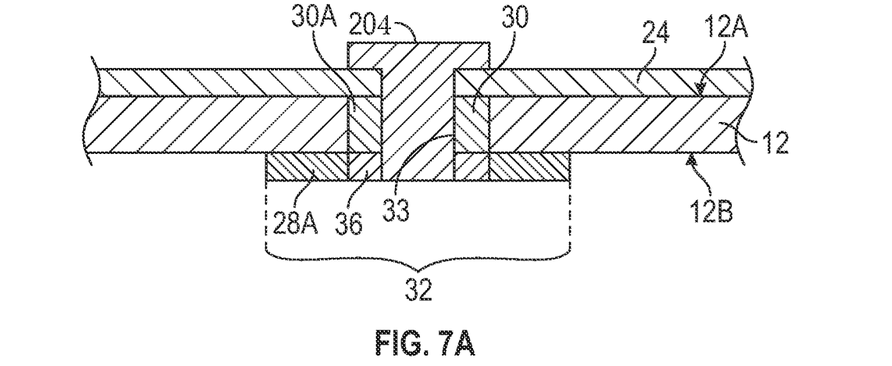
FIG. 7A is a cross section of a sheet and a via shown in FIG. 6 viewed in the direction of arrow 7A-7A.
Figure 7B:
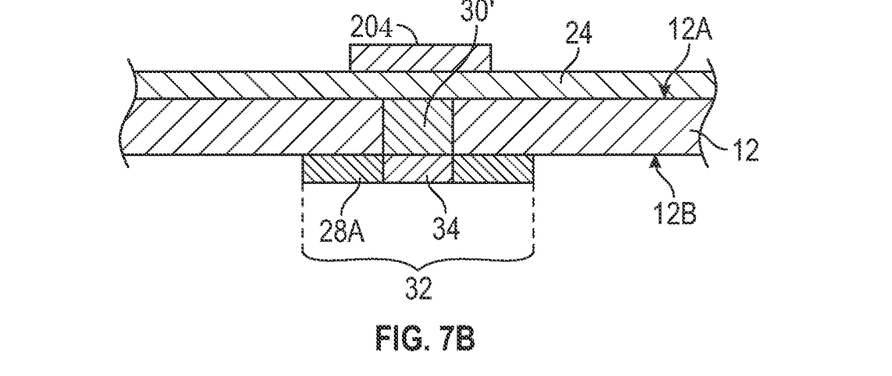
FIG. 7B is a cross section of a sheet and another example of a via shown in FIG. 6 viewed in the direction of arrow 7B-7B.

FIG. 7A shows a cross-section of the sheet 12 through one of the vias 30 after passing through the first machine 14. The resin repellant 204 is disposed within the hole 33 and overtop the annular body 30A of the via 30. FIG. 7B shows a cross-section of the sheet 12 through one of the vias 30' after passing through the first machine 14. The resin repellant 204 is disposed overtop the via 30'. In each aspect, the resin repellant 204 will repel resin from adhering to the portions of the honeycomb substrate 46 to which the resin repellant 204 is applied.

Returning to FIG. 6, the resin repellant 204 is formed of a material having a surface energy lower than the resin that is to be repelled. One example includes low surface energy wax-based materials such as inkjet printable UV Masking Black Wax 130 Degree Wax-JCHP7941 made by Luscher.

Once through the first machine 14, a number of the sheets 12 are then stacked to form a block 40. The adhesive 28 may be allowed to cure before optionally slicing or cutting the block 40 into sections 42. The sections 42 are then placed into the second machine 44 for expanding the sections 42 to form the honeycomb substrate 46. The honeycomb substrate 46 is then placed into the dip coating machine 52 to apply the resin over the honeycomb substrate 46. The resin adheres to the honeycomb substrate 46, however, the resin does not adhere to the resin repellant 204. Thus, the resin repellant 204 prevents resin from covering the vias 30 and portions of the traces 24. The honeycomb substrate 46 is then removed from the dip coating machine 52 and placed in the curing machine 54. The curing machine 54, such as an autoclave or oven, cures the resin on the honeycomb substrate 46 at an elevated temperature. Preventing the resin from covering the vias 30 and portions of the traces 24 allows electronic devices to be coupled to the traces 24 and/or the vias 30, as described below.

Once cured, the honeycomb substrate 46 is placed in a degrading machine 206. The degrading machine 206 degrades the resin repellant 204, i.e. removes the resin repellant 204, thus exposing the vias 30 and portions of the traces 24. In one aspect, degrading the resin repellant 204 includes washing the resin repellant 204 in a solvent. In another aspect, degrading the resin repellant 204 includes thermally degrading the resin repellant 204. Thermally degrading includes heating the resin repellant 204 to degrade the material. In yet another aspect, degrading the resin repellant 204 includes gravity floating the resin repellant 204. Gravity floating includes submerging the honeycomb substrate 46 in a solution (not shown) that allows the resin repellant 204 to float in the solution.

Figure 8:
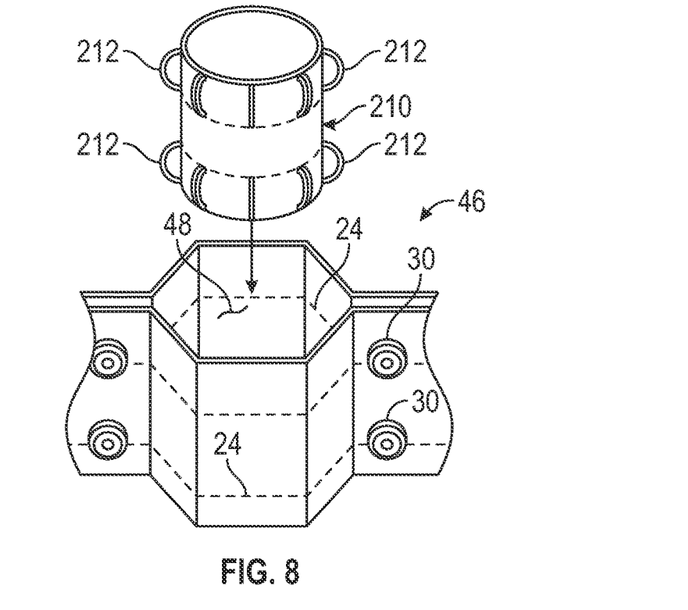
FIG. 8 is an exploded, perspective view of the honeycomb substrate and an electronic device.

Once degraded, the honeycomb substrate 46 is placed in an electronic device installation machine 208. The electronic device installation machine 208 is configured to insert a number of electronic devices 210 (shown in FIG. 8) into the honeycomb substrate 46. One or more electronic device installation machines 208 may be employed. The electronic device installation machine 208 may include an end factor(s) of robot arms (not shown) to automate the installation of the electronic devices 210. In one example, the electronic device installation machine 208 is a needle array of a spring-loaded sensor feeding device. FIG. 8 shows an exploded and enlarged view of a portion of the honeycomb substrate 46 with one of the electronic devices 210. The electronic device installation machine 208 (FIG. 6) inserts the electronic device 210 into one of the cells 48 of the honeycomb substrate 46. The electronic device 210 includes contacts 212 that are configured to contact the traces 24 which are not covered by the resin, thus creating an electrical circuit. The electronic device 210 may be secured in place within the cell 48 by using an adhesive or expandable material (not shown) such as foam or by permanent click-on feature (not shown) that mechanically engages within a via 30 for easy installation. The electronic device 210 may be a piezoelectric generator, a battery, a speaker, a noise cancellation/isolation device, an electrostatic discharging device, or any other device or combination of devices that may fit within the cells 48.

Returning to FIG. 6, once complete, the honeycomb core 56 may be placed in the one or more post-processing machines 58, such as laminating machines, out-of-autoclave curing machines, etc., to form a final part (not shown).

Figure 9:
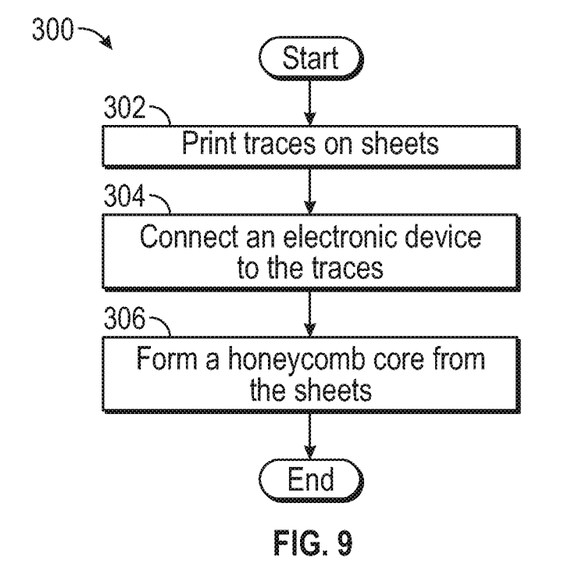
FIG. 9 is an exemplary process flow diagram illustrating a method of creating a honeycomb core having electronic components using the system of FIG. 1, according to an exemplary aspect.

With reference to FIG. 9, and continued reference to FIGS. 1-5, a flow chart of a method 300 for forming the honeycomb core 56 using the system 10 is illustrated. The method 300 begins at block 302 where a number of the traces 24 are printed on each of a number of the sheets 12 by the first machine 14. At block 304, the electronic devices 36 are connected to the traces 24. The electronic devices 36 are printed onto the sheets 12. At block 306, the honeycomb core 56 is formed from the sheets 12. Forming the honeycomb core 56 includes applying the adhesive 28 to the sheets 12, stacking the sheets 12 to form the block 40, cutting the block 40 to form the section 42, expanding the section 42 to form the honeycomb substrate 46, coating the honeycomb substrate 46 in the resin and curing the resin, as described above.

Figure 10:
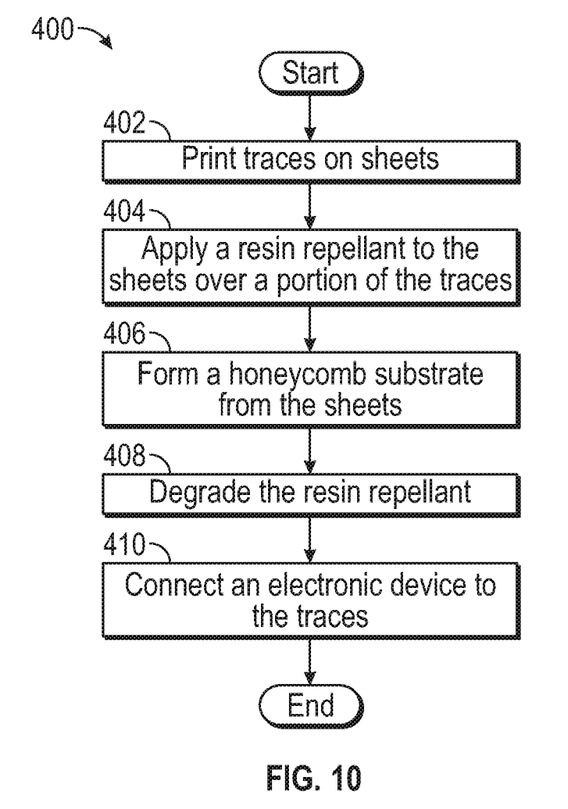
FIG. 10 is an exemplary process flow diagram illustrating a method of creating a honeycomb core having electronic components using the system of FIG. 6, according to an exemplary aspect.

With reference to FIG. 10, and continued reference to FIGS. 6-8, a flow chart of a method 400 for forming the honeycomb core 56 using the system 200 is illustrated. The method 400 begins at block 402 where a number of the traces 24 are printed on each of a number of the sheets 12 by the first machine 14. At block 404, the resin repellant 204 is applied to the sheets 12 overtop at least a portion of the traces 24. At block 406, the honeycomb substrate 46 is formed from the sheets 12. Forming the honeycomb substrate 46 includes applying the adhesive 28 to the sheets 12, stacking the sheets 12 to form the block 40, cutting the block 40 to form the section 42, expanding the section 42 to form the honeycomb substrate 46, coating the honeycomb substrate 46 in the resin and curing the resin.

At block 408 the resin repellant 204 is degraded by the degrading machine 206. Thus, the traces 24 are exposed from the resin. At block 410 the electronic device 210 is connected to the traces 24. The electronic device 210 is inserted into one of the cells 48 and the contacts 212 contact the traces 24 exposed from the resin.

The honeycomb core 56 produced using the system 10 with method 300 and the system 200 with the method 400 may be used in various composite parts. The traces 24 and the electronic devices 36, 210 allow for multiple functionality from the composite part without reducing the strength and acoustic properties of the composite part. For example, energy may be generated due to vibrations in the composite part and stored in batteries. The electrical circuit is designed such that if a number of the electronic devices 210 fail, the rest of the electronic devices 210 will still work by generating and storing energy. Thus, the honeycomb core 56 becomes an energy harvesting device to power electronics (not shown). For example, a surface mounted display (not shown) may be connected to the honeycomb core 56 to provide real-time information for a trip, advertisements, and safety related info utilizing energy generated during the trip. In addition, sensors may be used to provide feedback on the condition of the composite part, to name but a few applications.

Figure 11:
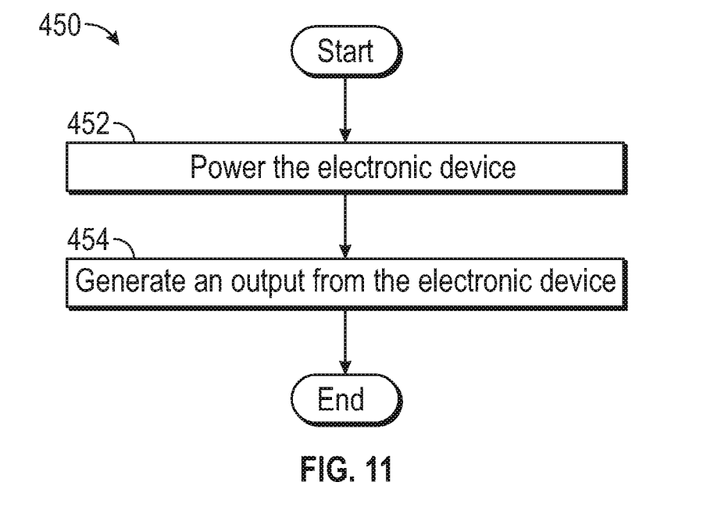
FIG. 11 is an exemplary process flow diagram illustrating a method of using a honeycomb core having electronic components using the systems of FIG. 1 and FIG. 6, according to an exemplary aspect.

FIG. 11 shows a method 450 of using the honeycomb core 56 having the electronic device 36 or the electronic device 210. The method 450 begins at step 452 by powering the electronic device 36 or the electronic device 210 disposed within the honeycomb core 56. In one aspect, the power is supplied by an external source (not shown) coupled to the traces 24 of the honeycomb core 56. In an alternate aspect, the electronic device 36 or the electronic device 210 generates the power and is, for example, a battery or piezoelectric generator. At step 454 an output is generated from the electronic device 36 or the electronic device 210. The output is dependent on the type of the electronic device 36 or the electronic device 210 employed. For example, in one aspect generating the output includes generating electrical power where the electronic device 36 or the electronic device 210 is a battery or piezoelectric generator. In another aspect, generating the output includes generating a data signal where the electronic device 36 or the electronic device 210 is a sensor. In yet another aspect, generating the output includes generating an electrostatic discharge. In yet another aspect, generating the output includes generating an acoustic signal. The acoustic signal may be either from a speaker or a nose cancellation signal.

Figure 12:
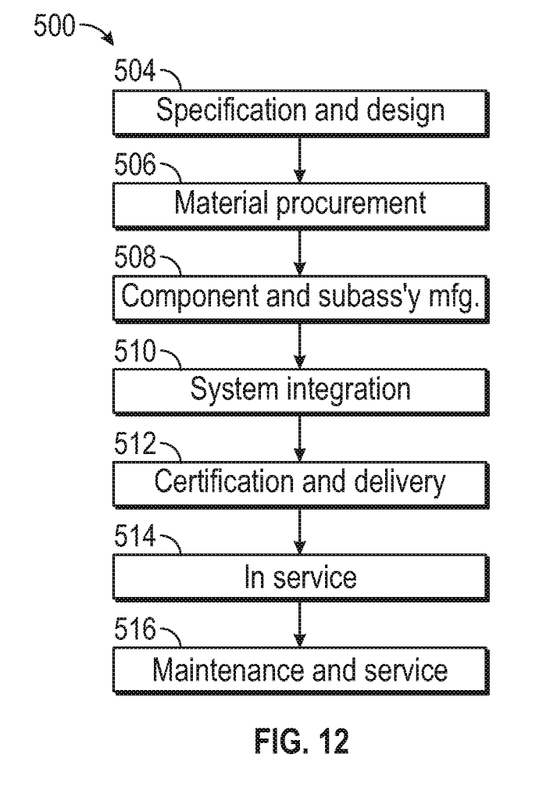
FIG. 12 is a flow diagram of aircraft production and service methodology.
Figure 13:
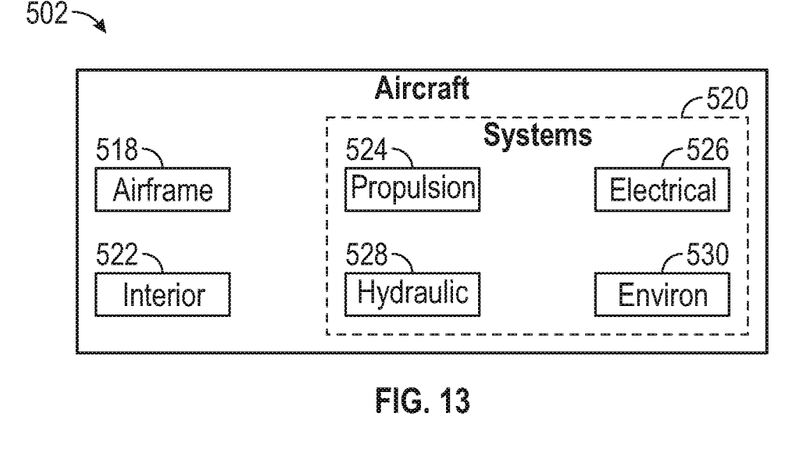
FIG. 13 is a block diagram of an aircraft.

Aspects of the system 10 and the system 200 described above, as well as the method 300, the method 400, and the method 450 may be employed in the context of an aircraft manufacturing and service method 500 as shown in FIG. 12 and an aircraft 502 as shown in FIG. 13. During preproduction, exemplary method 500 may include specification and design 504 of the aircraft 502 and material procurement 506. During production, component and subassembly manufacturing 508 and system integration 510 of the aircraft 502 takes place. Thereafter, the aircraft 502 may go through certification and delivery 512 in order to be placed in service 514. While in service by a customer, the aircraft 502 is scheduled for routine maintenance and service 516 (which may also include modification, reconfiguration, refurbishment, and so on).

Each of the processes of the systems and methods described herein may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 13, the aircraft 502 produced by exemplary method 500 may include an airframe 518 with a plurality of systems 520 and an interior 522. Examples of systems 520 include one or more of a propulsion system 524, an electrical system 526, a hydraulic system 528, and an environmental system 530. Any number of other systems may be included. Although an aerospace example is shown, the principles of the disclosure may be applied to other industries, such as the automotive industry.

The system and methods described above may be employed during any one or more of the stages of the exemplary method 500. For example, components or subassemblies corresponding to component and subassembly manufacturing 508 may be fabricated or manufactured in a manner similar to components or subassemblies produced while the aircraft 502 is in service. Also, one or more apparatus aspects, method aspects, or a combination thereof may be utilized during the component and subassembly manufacturing 508 and system integration 510, for example, by substantially expediting assembly of or reducing the cost of an aircraft 502. Similarly, one or more of apparatus aspects, method aspects, or a combination thereof may be utilized while the aircraft 502 is in service, for example and without limitation, to maintenance and service 516. Aspects of the system 10 and the system 200 described above, as well as the methods 300, 400, and 450 may be employed with the material procurement 506, the component and subassembly manufacturing 508, the system integration 510, the service 514 of the aircraft, the routine maintenance and service 516, the airframe 518, and the interior 522.

The description of the present disclosure is merely exemplary in nature and variations that do not depart from the gist of the present disclosure are intended to be within the scope of the present disclosure. Such variations are not to be regarded as a departure from the spirit and scope of the present disclosure.

The following is claimed:

1. A honeycomb core comprising:
   a honeycomb substrate comprised of a number of sheets;
   a number of traces comprised of a conductive ink printed onto a surface of the sheets of the honeycomb substrate;
   a resin repellant disposed overtop at least one of the traces; and
   a resin disposed on the sheets and overtop at least a portion of the traces not covered by the resin repellant.

2. The honeycomb core of claim 1, further comprising an electronic device disposed in the honeycomb substrate and connected to the traces.

3. The honeycomb core of claim 2, wherein the electronic device is printed onto one of the sheets.

4. The honeycomb core of claim 2, wherein the electronic device is disposed within a cell defined by the honeycomb substrate.

5. The honeycomb core of claim 1, further comprising vias disposed through the sheets of the honeycomb substrate.

6. The honeycomb core of claim 5, wherein the sheets are bonded together along bond lines, and the vias are disposed at the bond lines.

7. The honeycomb core of claim 6, wherein the vias are grommets that are disposed through the sheets and each define a hole.

8. The honeycomb core of claim 7, wherein the vias are electrically conductive.

9. The honeycomb core of claim 7, wherein the resin repellant is disposed within the hole defined by the grommet.

10. The honeycomb core of claim 6, wherein the vias are electrically conductive rivets that extend through the sheets.

11. The honeycomb core of claim 6, wherein the vias are connected to the traces.

12. The honeycomb core of claim 6, further comprising a conductive adhesive disposed between vias, wherein the vias are aligned with and adjacent to one another.

13. The honeycomb core of claim 6, wherein the resin repellant is disposed overtop at least one of the vias.

14. The honeycomb core of claim 1, wherein the resin covers the entire honeycomb substrate except for the resin repellant.

15. The honeycomb core of claim 1, wherein the resin repellant is formed of a material having a surface energy lower than the resin.

16. The honeycomb core of claim 1, wherein the sheets are an aromatic polyamide paper.

17. The honeycomb core of claim 1, wherein the resin is a phenolic resin having a surface energy ranging from 40 to 50 dyn/cm.

18. The honeycomb core of claim 1, wherein the resin is an Epoxy or a polyester resin.

19. The honeycomb core of claim 1, wherein the resin is a cured resin.

20. The honeycomb core of claim 1, further comprising vias disposed through the sheets of the honeycomb substrate and each of the vias define a hole, and wherein the resin repellant is disposed within the hole.

21. A honeycomb core comprising:
a honeycomb substrate comprised of a number of sheets;
a number of traces comprised of a conductive ink printed onto a surface of the sheets of the honeycomb substrate;
a resin disposed on the sheets and overtop at least a portion of the traces; and
vias disposed through the sheets of the honeycomb substrate, wherein each of the vias define a hole, and wherein a resin repellant is disposed within the hole.

22. A honeycomb core comprising:
a honeycomb substrate comprised of a number of sheets, wherein the sheets are bonded together along bond lines;
a number of traces comprised of a conductive ink printed onto a surface of the sheets of the honeycomb substrate;
vias disposed through the sheets of the honeycomb substrate, wherein the vias are disposed at the bond lines;
a resin repellant disposed overtop at least one of the traces;
a resin disposed on the sheets and overtop at least a portion of the traces not covered by the resin repellant; and
a conductive adhesive disposed between vias, wherein the vias are aligned with and adjacent to one another.

23. Fabricating a portion of an aircraft using the honeycomb core of claim 1.

24. A method for creating a honeycomb core, the method comprising:
providing a honeycomb substrate comprised of a number of sheets;
printing a number of traces comprised of a conductive ink on a surface of each of the number of sheets;
applying a resin repellant disposed overtop at least one of the traces;
applying a resin on the sheets and overtop at least a portion of the traces not covered by the resin repellant; and
forming the honeycomb core from the sheets.

25. The method of claim 24, further comprising connecting an electronic device to the traces.

26. The method of claim 25, wherein connecting the electronic device to the traces includes printing the electronic device onto the sheets.

27. The method of claim 24, further comprising creating vias through the sheets.

* * * * *